(12) United States Patent
Takasawa et al.

(10) Patent No.: US 6,943,089 B2
(45) Date of Patent: Sep. 13, 2005

(54) SEMICONDUCTOR DEVICE MANUFACTURING METHOD AND SEMICONDUCTOR MANUFACTURING APPARATUS

(75) Inventors: Yushin Takasawa, Tokyo (JP); Hajime Karasawa, Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 462 days.

(21) Appl. No.: 09/983,355

(22) Filed: Oct. 24, 2001

(65) Prior Publication Data

US 2002/0025651 A1 Feb. 28, 2002

Related U.S. Application Data

(63) Continuation of application No. 09/386,370, filed on Aug. 31, 1999, now abandoned.

(30) Foreign Application Priority Data

Sep. 4, 1998 (JP) .......................................... 10-251306
Aug. 31, 1999 (JP) .......................................... 11-245061

(51) Int. Cl.$^7$ ............................................. H01L 21/20
(52) U.S. Cl. ..................... 438/381; 438/398; 438/255; 438/396; 438/253; 438/964
(58) Field of Search ............................. 438/381, 255, 438/396, 398, 964, 253

(56) References Cited

U.S. PATENT DOCUMENTS

| 5,885,867 A | * | 3/1999 | Shin et al. ................... 438/255 |
| 5,959,326 A | | 9/1999 | Aiso et al. ................... 257/306 |
| 5,960,281 A | * | 9/1999 | Nam et al. ................... 438/255 |
| 6,093,617 A | | 7/2000 | Su et al. ..................... 438/398 |

FOREIGN PATENT DOCUMENTS

JP B2-2508948 4/1996

* cited by examiner

*Primary Examiner*—B. William Baumeister
*Assistant Examiner*—Igwe U. Anya
(74) *Attorney, Agent, or Firm*—Oliff & Berridge, PLC

(57) ABSTRACT

A hemispherical grain (HSG) formation process for enlarging the surface area of a capacitor electrode, wherein stable, defect-free HSG, having outstanding selectivity, is formed. An amorphous silicon layer, which constitutes a capacitor electrode, is formed on an Si wafer, on which is formed a silicon-based dielectric layer, which constitutes an interlevel dielectric layer. An HSG layer, in which there exists practically no defects, is formed on the amorphous silicon layer at a crystal nuclei formation temperature of under 620° C. Further, in accordance with properly controlling the crystal nuclei formation temperature, and the flow rate of monosilane ($SiH_4$), which is supplied for crystal nuclei formation, it is possible to furnish selectivity such that HSG nuclei are formed solely on the amorphous silicon layer, without being formed on a silicon-based dielectric layer.

15 Claims, 8 Drawing Sheets

|  | COMPARATIVE EXAMPLE | EMBODIMENT |
|---|---|---|
| REACTION CHAMBER | $10^{-6}$ | $10^{-6}$ |
| TRANSFER CHAMBER | $10^{-6}$ | $10^{-2}$ |
| LOAD-LOCK CHAMBER | $10^{-6}$ | $10^{-2}$ |

(UNITS : Pa)

SEMICONDUCTOR DEVICE MANUFACTURING METHOD AND SEMICONDUCTOR MANUFACTURING APPARATUS

This is a Continuation of application Ser. No. 09/386,370 filed Aug. 31, 1999 now abandoned.

BACKGROUND OF THE INVENTION

1. Field of Invention

The present invention is related to a semiconductor device manufacturing method and a semiconductor manufacturing apparatus, and more particularly to a semiconductor device manufacturing method and a semiconductor manufacturing apparatus, which comprise a process for forming an extremely ragged HSG (Hemi-spherical Grained Silicon) on the surface of an amorphous silicon layer, and for making this HSG formed layer (HSG layer) a capacitor electrode having a large surface area.

2. Description of Related Art

A conventional DRAM (Dynamic Random Access Memory) capacitor cell having a capacitor electrode comprising an HSG layer will be explained by referring to FIG. 9. Layer 1 is a silicon substrate, on which are formed a field oxide layer 2, source 3, and drain 4, respectively. Layer 5 is a gate oxide layer formed on the silicon substrate 1 between the source 3 and the drain 4. Layer 6 is a gate electrode formed on the gate oxide layer 5, layer 7 is a silicon interlevel dielectric layer, and element 8 is a contact hole formed in the interlevel dielectric layer 7 above the source 3.

An amorphous silicon layer is deposited on the interlevel dielectric layer 7 extending between the source-drain, patterning is performed, a natural oxide layer of the amorphous silicon layer is removed following cleaning, crystallization is carried out, and a bottom electrode 9 is formed. Next, an $Si_3N_4$ capacitor dielectric layer 13 is formed, and a top electrode 11 is formed thereon using a polysilicon layer or the like. A DRAM having a capacitor cell in the source 3 of a MOS (Metal-Oxide Semiconductor) transistor can be realized in this fashion.

Now, a DRAM capacitor is required to have a nearly fixed capacitance value, but because the area occupied by a capacitor cell decreases as the level of DRAM integration increases, the lowering of the capacitor capacitance value cannot be avoided. As methods for maintaining the capacitor capacitance value at a fixed level, the capacitor dielectric layer can be made into a thin film, a dielectric layer with a high dielectric constant can be used, and/or the surface of the electrode can be enlarged, but making the $Si_3N_4$ layer used as a capacitor dielectric layer thinner has about reached its limit. Consequently, the use of a high dielectric constant dielectric layer such as a $Ta_2O_5$ layer instead of a low dielectric constant dielectric layer like $Si_3N_4$ is under study. However, the problem with a high dielectric constant dielectric layer is that the conditions for forming same are troublesome, and even for a $Ta_2O_5$ layer, which is an especially promising candidate, post-formation processing is uncertain, and is still in the research stage, and it is not yet ready to be used in volume production. Therefore, until such time as a high dielectric constant dielectric layer can be utilized, the situation is such that maintaining the capacitor capacitance value must be achieved by enlarging the surface area of the electrode.

There are some methods for enlarging the surface of an electrode. One is stacking. Capacitor capacitance is greatly increased by stacking, but because this poses problems for such downscaling techniques as depth-of-focus exposure and dry etching, other methods are being sought. Among these, as shown in FIG. 10, there has been proposed a capacitor electrode portion formation technology (Japanese Patent Laid-open No. 5-304273 (U.S. Pat. No. 2,508,948)), which, in accordance with controlling the nuclei formation temperature of a pre-crystallization amorphous silicon, which constitutes a bottom electrode 9, forms a bumpy HSG 12 on the silicon surface, making the surface area of the formed HSG 12 thereof 2 or more times greater than the surface area of a polysilicon layer formed, for example, at 600° C.

This proposal is premised on the surface of the amorphous silicon layer being in a substantially clean state, and does not particularly limit the thin film formation method to a CVD (Chemical Vapor Deposition) or a MBE (Molecular-Beam Epitaxy) method, and because it enables the size of the crystal grain to be controlled easily by raising the heating temperature for crystal nuclei generation, and lowering the temperature for crystal nuclei growth, it diminishes the size of the average crystal grain in accordance with generating crystal nuclei by heating the amorphous silicon layer at a prescribed temperature, and then growing crystal nuclei by lowering the temperature.

Further, this proposal is constituted so that crystal nuclei generation and growth are carried out at the same temperature, but control of crystal grain density and crystal grain size is facilitated in accordance with shutting off at crystal nuclei growth the supply of a silicon compound gas supplied during crystal nuclei formation, enabling the formation of a polysilicon layer with an even finer grain size.

Furthermore, there is a method, which is described in detail in the above-mentioned announcement, and this method particularly limits the thin film formation method to an MBE method, and by generating crystal nuclei in accordance with irradiating an amorphous silicon layer with a silicon molecular beam while applying heat at a prescribed temperature, and by continuing to apply heat but not irradiating a silicon molecular beam during crystal nuclei growth, enables the generation of crystal nuclei at a low temperature without using a chemical reaction.

Referring to the above-mentioned HSG layer formation, the following items are required:

(1) From the standpoint of semiconductor device yield, uniform HSG grain size and grain density. For this reason, it is necessary to eliminate defects, thus making surface state, as well as temperature control extremely important until an HSG layer is formed. HSG is a technology, which makes use of volumetric fluctuations generated in the process of changing from an amorphous to a polycrystalline state, and what is referred to herein as a defect is a portion, which constitutes a state in which an amorphous silicon substrate is converted to a crystal, volumetric fluctuation is retarded, and HSG is not formed.

(2) The possibility of selective HSG layer growth. Here, selective HSG layer growth refers to the formation, in the process for forming the capacitor electrode portion of FIG. 9, of HSG only on the surface of the amorphous silicon layer-based bottom electrode 9 of the capacitor electrode portion, without forming HSG on the surface of the interlevel dielectric layer 7 of the non-capacitor electrode portion exposed by capacitor electrode isolation, which forms the bottom electrode 9 relative to the interlevel dielectric layer 7 comprising a silicon-based dielectric layer. In the formation of HSG, it is necessary that only the crystal nuclei of a silicon layer (possible at low temperatures over a short period of time) be formed and grown on an amorphous silicon layer, without growing a silicon layer. The reason HSG is not grown on a dielectric layer, such as a silicon-based dielectric layer, is because incubation time until silicon layer nuclei formation is longer than on an amorphous silicon layer. The reason such selective HSG growth is required is because when the non-capacitor electrode portion is covered by a silicon layer in accordance with the formation of HSG, etchback must be performed once again, thereby increasing the number of manufacturing processes of a semiconductor device, and increasing the danger that the capacitor electrode sidewall portion will be etched as a result of etchback.

(3) Relating to HSG formation throughput, it is desirable that it be 16 wafers or more per hour with a batch mode vertical-type apparatus.

From the standpoint thereof, with a constitution that uses the MBE method in the above-mentioned announcement, the uniformity of HSG grain size and grain density of the above-described (1) is good, but the selective growth of (2) is not possible, and it is difficult to achieve the throughput of (3).

Conversely, the use of a CVD method in the formation of capacitor electrode portion HSG is also explained in the above-mentioned announcement. With a CVD method, temperature control becomes especially important, but a specific example thereof is not provided in the above-mentioned announcement. Accordingly, an HSG formation technology that utilizes a CVD method is discussed hereinbelow. A layer formation method using a CVD apparatus constitutes a batch mode and a single wafer mode.

In the batch mode, a batch mode vertical-type apparatus is ordinarily utilized. With this apparatus, because heating of a wafer is from the side surface due to the fact that it is peripheral heating, which applies heat from an external portion of a reaction tube, inplane temperature uniformity is difficult to achieve. Further, a time difference occurs from the entry into the furnace of the top portion of a wafer boat, in which a plurality of wafers are mounted, until the entry into the furnace of the bottom portion of the wafer boat, and a time difference occurs between the egress from the furnace of the bottom portion, and the egress from the furnace of the top portion of a wafer boat. Consequently, due to the fact that the heat history differs between a wafer located at the top of a boat, and a wafer located at the bottom of a boat, the inplane/inter-surface heat distribution of the wafers is susceptible to variation. Therefore, the problem is that because the surface condition of a wafer on which a layer is to be formed, as well as the nuclei formation temperature are not fixed, a prescribed grain density cannot be uniformly achieved in an HSG, and HSG grain size is not uniform.

Temperature stability is necessary to form HSG grain size and grain density uniformly, but in the batch mode, the formation period to achieve a prescribed HSG grain size and grain density requires a long time. However, the continuous heating of a wafer over a long period of time makes defects more apt to occur. That is, the problem is that the base amorphous silicon layer is crystallized, thereby making HSG formation more prone to retardation. This problem can theoretically be solved by optimizing temperature and time, but in actuality, the optimization of process conditions is impossible. Further, when HSG formation takes a long time, throughput is lowered. Therefore, all the conditions of the above-mentioned (1)–(3) cannot be satisfied even using the technology of the above-mentioned announcement in the batch mode.

Meanwhile, in the single wafer mode, there is a constitution that uses a cold-wall-type single wafer mode apparatus, and a constitution that uses a hot-wall-type single wafer mode apparatus.

With a cold-wall-type single wafer mode apparatus, in which a wafer is heated by a heater mounted inside a reaction chamber, due to the fact that a temperature difference of around ±1.0° C. between the center portion and the peripheral portion of a wafer, wafer inplane uniformity is apt to deteriorate during HSG grain formation. Therefore, even if the technology of the above-mentioned announcement were to be used in a cold-wall-type single wafer apparatus, the conditions of at the least (1) could not be satisfied.

By contrast thereto, with a hot-wall-type single wafer mode apparatus, in which a wafer is heated using a heater or the like from the outer surface of a reaction chamber, because of good partitioned heater control, both wafer inter-surface and inplane temperatures can be made uniform in accordance with performing partitioned heater control, but the optimum conditions for HSG formation are unclear. Furthermore, it is said that even if partitioned heater control is performed in a cold-wall system, inplane temperature uniformity is not as good as it is with a hot-wall system.

As described above, with a batch mode, the problem is process related in that a long time is required until temperatures stabilize, and with a cold-wall system, because of the difficulty maintaining temperature uniformity, HSG uniformity is prone to deterioration. By contrast thereto, a single wafer mode hot-wall system is effective, but the optimum conditions for HSG uniformity are unclear.

An object of the present invention is to provide, in the HSG process, wherein temperature control becomes the key point, a semiconductor device manufacturing method, which solves for the above-mentioned problem points of conventional technologies by finding the optimum conditions of the HSG process, and which is capable of forming a stable HSG layer with no defects, and further, which makes it possible to furnish selectivity.

Further, an object of the present invention is to provide a semiconductor manufacturing apparatus, which is capable of implementing the above-mentioned manufacturing method in accordance with slight changes to existing equipment.

SUMMARY OF THE INVENTION

A first invention is a semiconductor device manufacturing method, which, when forming an HSG layer on a substrate, on the surface of which is formed an amorphous silicon layer constituting a capacitor electrode, forms the above-mentioned HSG layer by forming at a prescribed temperature range crystal nuclei, which constitute the nuclei of the above-mentioned HSG, and growing the above-mentioned crystal nuclei so that practically no defects, which are portions on which HSG are not formed, occur in an HSG layer formed on the above-mentioned amorphous silicon layer.

The substrate is a silicon wafer or other semiconductor substrate, or a glass substrate. To form amorphous silicon, $SiH_4$, $Si_2H_6$, $Si_3H_3$, $SiH_2F_2$ or the like is utilized as a raw material gas. A formation method therefor is in accordance with either a thermal CVD (LPCVD (Low-Pressure CVD)) method, or a plasma CVD method. As for the semiconductor device, it is a device that requires capacitance, such as, for example, a DRAM.

The present invention comprises a process, wherein an HSG layer for enlarging the surface area of an electrode is formed on the surface of an amorphous silicon layer, which constitutes the bottom electrode of a capacitor formed on a semiconductor wafer or some other substrate. When forming an HSG layer for enlarging the surface of an electrode, if the crystal nuclei that constitute the nuclei of an HSG layer are formed at a prescribed temperature range in accordance with a single wafer mode CVD method, practically no defects occur in the HSG layer.

Narrowly defined, a single wafer mode is a system for processing wafers one at a time, but here the broad meaning of the term is used, and it also includes cases in which around 2 wafers are processed. As a single wafer CVD method, a hot-wall system, which is capable of maintaining the temperature distribution of a wafer at ±0.5° C., is desirable, but if it is capable of maintaining the above-mentioned temperature distribution, a cold-wall system is also good. A hemispherical grain (HSG) is a crystal grain of either a hemispherical shape, or a mushroom shape. A hemispherical grain is formed by allowing $SiH_4$ (monosilane) to flow within the above-mentioned temperature range.

A second invention is a semiconductor device manufacturing method according to the first invention, wherein the above-mentioned prescribed temperature range is set at under 620° C.

When using a single wafer mode apparatus, since defects occur at an HSG nuclei formation processing temperature of 620° C., but practically no defects occur at under 620° C., under 620° C. is desirable. Substrate heating time until HSG is formed is shorter when using a single wafer mode apparatus than when a batch mode apparatus is used, and with a time duration of this extent, defects are dependent solely on temperature. At high temperatures in excess of 620° C., the amorphous silicon, which is the base, begins to crystallize. As a result thereof, even if annealing for crystal nuclei growth is performed for a portion which has crystallized, the migration of silicon molecules of the silicon layer surface is retarded, HSG is not formed, and a defect occurs. In accordance with performing annealing for an amorphous portion (a portion that is not crystallized), HSG is formed by the migration and aggregation of silicon molecules of the amorphous silicon layer surface peripherally to crystal nuclei.

According to the present invention, because it is possible to form an HSG layer in which practically no defects exist, the yield of semiconductor devices having capacitor cells is enhanced.

A third invention is a semiconductor device manufacturing method according to the second invention, wherein the temperature range, which was set to the above-mentioned 620° C. or less, is further reduced to less than 615° C. In accordance therewith, it is possible to form an HSG layer in which it is almost certain that no defects exist.

A fourth invention is a semiconductor device manufacturing method, which is constituted so that, when an HSG layer is formed on a substrate on the surface of which is formed a silicon-based dielectric layer and an amorphous silicon layer, which constitutes a capacitor electrode, crystal nuclei are formed by controlling nuclei formation temperature and $SiH_4$ flow rate so that same fall within an area to the left of a straight line A, which connects a point (620° C., 100 sccm) to a point (610° C., 200 sccm) when the formation temperature (° C.) of crystal nuclei, which constitute the nuclei of the above-mentioned HSG layer, is represented along an X axis, and the flow rate (sccm) of monosilane ($SiH_4$) supplied for crystal nuclei formation is represented along a Y axis, and the above-mentioned HSG layer is formed by growing the above-mentioned crystal nuclei so that the above-mentioned HSG layer is selectively grown only on the above-mentioned amorphous silicon layer without being grown on the above-mentioned silicon-based dielectric layer.

Selective growth refers to the formation of HSG by furnishing it with selectivity relative to a silicon-based dielectric layer, which constitutes an interlevel dielectric layer, and when a silicon-based dielectric layer is formed peripherally to a capacitor electrode, it refers to the formation of an HSG layer solely on the surface of the amorphous silicon layer of the capacitor electrode without forming HSG on the surface of the silicon-based dielectric layer, which constitutes a non-capacitor electrode portion.

The process that influences selectivity is the nuclei formation process, and selectivity is dependent not only on temperature, but also on duration, pressure, and the flow rate of $SiH_4$. However, the respective limitations placed on time, from the standpoint of throughput, and on pressure, from the need to maintain the cleanliness of the substrate surface, means these conditions are determined spontaneously. For example, nuclei formation time is from around 2 minutes to 2.5 minutes. And pressure is around $10^{-1}$ Pa. Accordingly, those conditions that remain as controllable parameters constitute temperature and $SiH_4$ flow rate.

According to the present invention, because high selectivity is achieved, and an HSG layer is only formed on the surface of an amorphous silicon layer, it is not necessary to perform etchback on a non-capacitor electrode portion. Therefore, manufacturing is facilitated without increasing manufacturing processes.

A fifth invention is a semiconductor device manufacturing method according to the fourth invention, wherein crystal nuclei are once again formed at a prescribed temperature range so that in the above-mentioned HSG layer there occur practically no defects, which are portions on which HSG is not formed. According to the present invention, because crystal nuclei are formed at a prescribed temperature range, practically no defects occur in an HSG layer.

A sixth invention is a semiconductor device manufacturing method according to the fifth invention, wherein crystal nuclei are once again formed at a temperature of under 620° C. so that in the above-mentioned HSG layer there occur practically no defects, which are portions on which HSG is not formed. According to the present invention, because an HSG layer with high selectivity can be formed with practically no defects, manufacturing is facilitated, and high yields are achieved.

A seventh invention is a semiconductor device manufacturing method according to the sixth invention, wherein the nuclei formation temperature of crystal nuclei is set to 615° C. or less so that in the above-mentioned HSG layer, which is formed on the above-mentioned amorphous silicon layer, there occur practically no defects, which are portions on which HSG is not formed. In accordance therewith, it is possible to form an HSG layer which is almost certain to have no defects.

An eighth invention is a semiconductor manufacturing apparatus, which comprises a reaction chamber for forming an HSG layer on an amorphous silicon layer, which is formed on a substrate; $SiH_4$ supply means for supplying to the above-mentioned reaction chamber monosilane ($SiH_4$) gas, which constitutes the raw material for an HSG layer; heating means for heating the inside of the above-mentioned reaction chamber; and controlling means for controlling the temperature inside the above-mentioned reaction chamber, the above-mentioned controlling means controlling the above-mentioned heating means so that the nuclei formation temperature of crystal nuclei, which constitute the nuclei of the above-mentioned HSG layer, constitute a prescribed temperature range so that in an HSG layer to be formed on the above-mentioned amorphous silicon layer there occur practically no defects, which are portions on which HSG is not formed.

According to the present invention, by providing controlling means for controlling the temperature inside a reaction chamber so that same becomes a prescribed temperature range, it is possible to form an HSG layer in which practically no defects exist.

A ninth invention is a semiconductor manufacturing apparatus according to the eighth invention, wherein the above-mentioned prescribed temperature range is set at under 620° C. In accordance with providing controlling means for controlling the temperature inside a reaction chamber so that same is under 620° C., it is possible to form an HSG layer in which practically no defects exist.

A tenth invention is a semiconductor manufacturing apparatus according to the ninth invention, wherein the temperature range, which was set to the above-mentioned 620° C. or less, is further reduced to less than 615° C. In accordance therewith, it is possible to form an HSG layer in which it is almost certain that no defects exist.

An eleventh invention is a semiconductor manufacturing apparatus, which comprises a reaction chamber for forming an HSG layer on an amorphous silicon layer, which is formed on a substrate; $SiH_4$ supply means for supplying to the above-mentioned reaction chamber monosilane ($SiH_4$) gas, which constitutes the raw material for an HSG layer; heating means for heating the inside of the above-mentioned reaction chamber; and controlling means for controlling the flow rate of $SiH_4$ gas, which is supplied to the inside of the above-mentioned reaction chamber, and for controlling the temperature inside the above-mentioned reaction chamber, the above-mentioned controlling means controlling the above-mentioned $SiH_4$ supply means and the above-mentioned heating means so that the temperature range and $SiH_4$ flow rate fall within an area to the left of a straight line A, which connects a point (620° C., 100 sccm) to a point (610° C., 200 sccm) when the formation temperature of crystal nuclei, which constitute the nuclei of an HSG layer, is represented along an X axis, and the flow rate of monosilane ($SiH_4$) supplied for crystal nuclei formation is represented along a Y axis.

According to the present invention, by providing controlling means for controlling an $SiH_4$ flow rate and the temperature inside a reaction chamber so that same fall within prescribed ranges, it is possible to form an HSG layer with high selectivity, which enables the formation of an HSG layer solely on an amorphous silicon layer.

A twelfth invention is a semiconductor manufacturing apparatus according to the eleventh invention, wherein the above-mentioned controlling means controls the above-mentioned heating means so that a prescribed temperature range is constituted once again so that in the above-mentioned HSG layer there occur practically no defects, which are portions on which HSG is not formed. In accordance therewith, it is possible to form a highly selective HSG layer in which practically no defects exist.

A thirteenth invention is a semiconductor manufacturing apparatus according to the twelfth invention, wherein the above-mentioned prescribed temperature range is set at under 620° C. In accordance with providing controlling means for controlling an $SiH_4$ flow rate and the temperature inside a reaction chamber so that same is under 620° C., it is possible to form a highly selective HSG layer in which practically no defects exist.

A fourteenth invention is a semiconductor manufacturing apparatus according to the thirteenth invention, wherein the temperature range, which was set to the above-mentioned 620° C. or less, is further reduced to less than 615° C. In accordance therewith, it is possible to form an HSG layer in which it is almost certain that no defects exist.

DETAILED DESCRIPTION OF PREFERRED EMBODIMENTS

Figure 5:
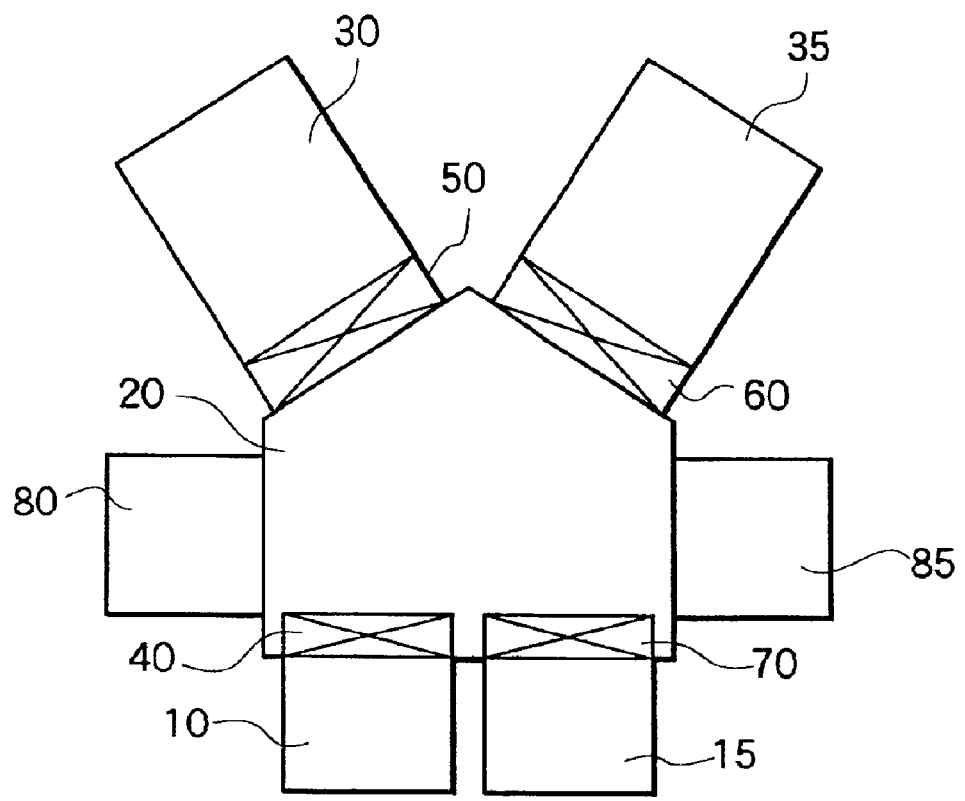
FIG. 5 is a simplified plan view of a semiconductor manufacturing apparatus for explaining an aspect of the embodiment.

Aspects of the embodiment of the present invention will be explained hereinbelow by referring to the figures. FIG. 5 is a plan view of a semiconductor manufacturing apparatus, which forms an HSG layer, FIG. 6 is a vertical cross-sectional view of a hot-wall-type single wafer mode film growth apparatus within a semiconductor manufacturing apparatus, and FIG. 7 is a detailed view of a heater, which heats a reaction chamber.

In FIG. 5, which shows a semiconductor manufacturing apparatus, 20 is a transfer chamber, and there are provided a first load-lock chamber 10, a first processing chamber 80, a first reaction chamber 30, a second reaction chamber 35, a second processing chamber 85, and a second load-lock chamber 15, which constitute a plurality of vacuum chambers radially surrounding this transfer chamber, and between the transfer chamber 20 and the first load-lock chamber 10, the first reaction chamber 30, the second reaction chamber 35, and the second load-lock chamber 15, respectively, there are provided gate valves 40, 50, 60, 70. Furthermore, a wafer transfer robot, not shown in the figure, is provided in the transfer chamber 20.

Figure 6:
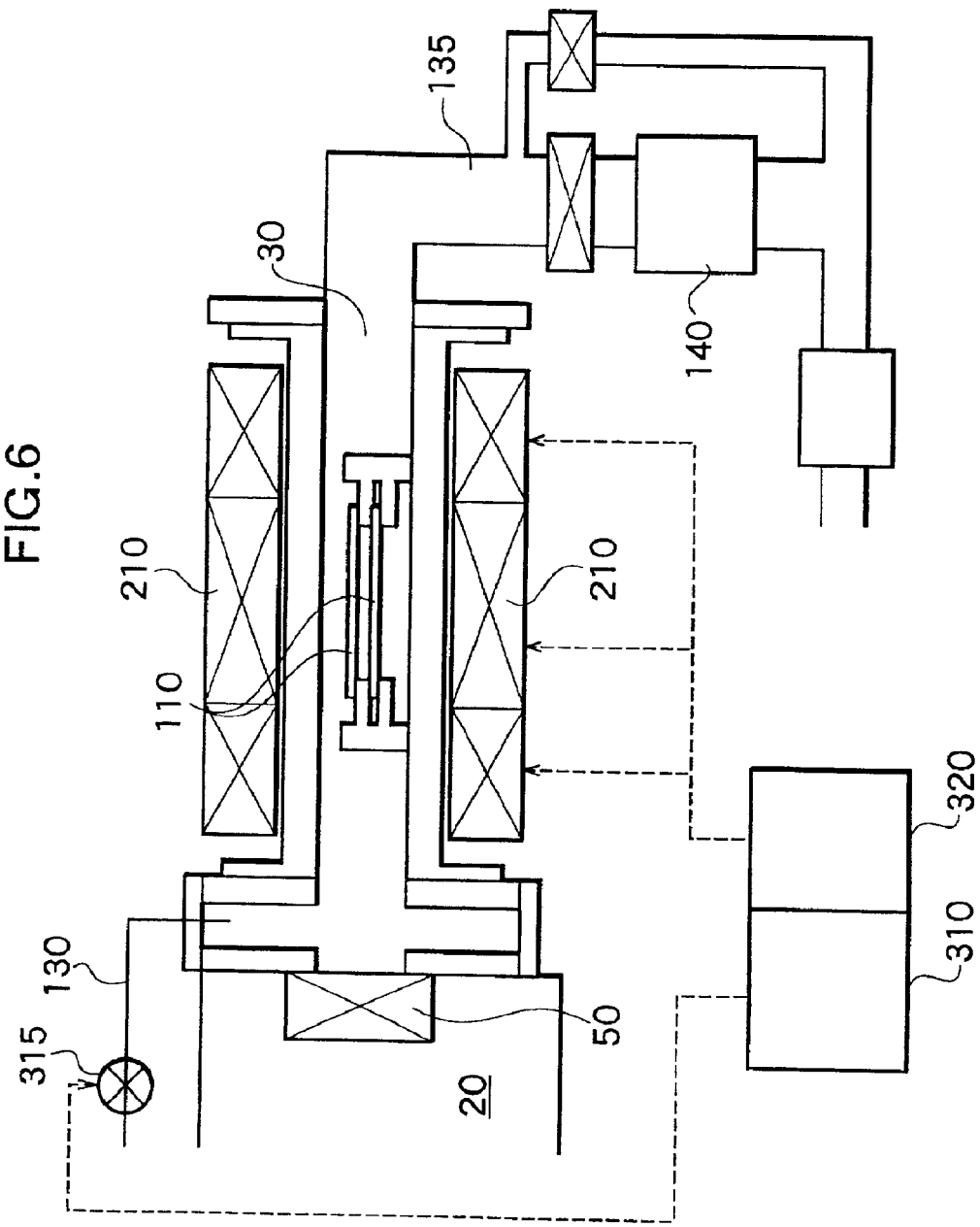
FIG. 6 is a vertical cross-sectional view of a single wafer mode film growth apparatus for explaining an aspect of the embodiment.
Figures 7, 8:
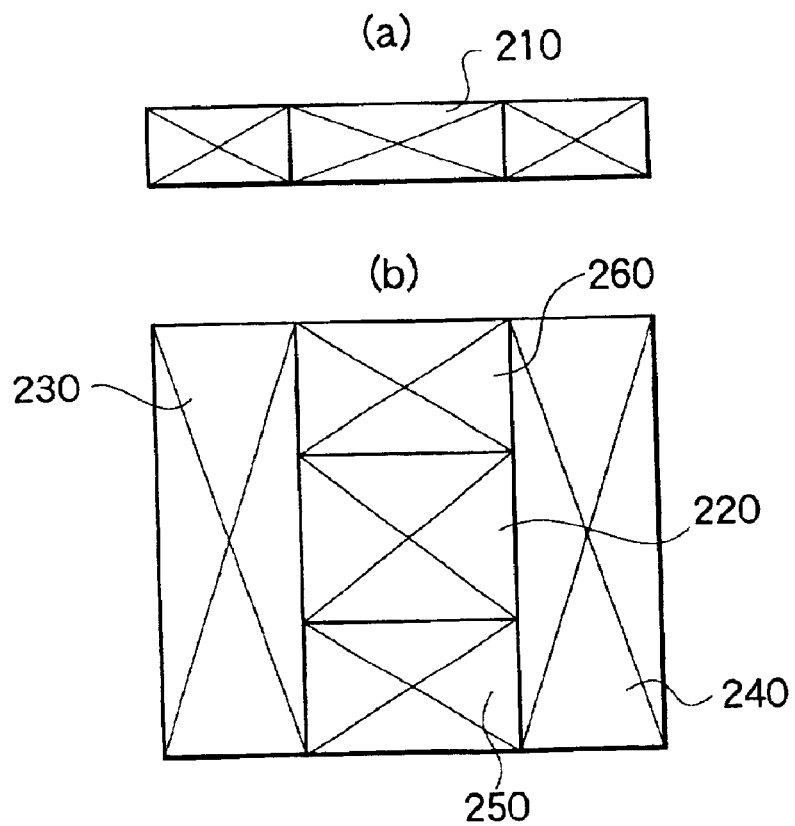
FIG. 7 is a detailed view of a reaction chamber heater for explaining an aspect of the embodiment.
FIG. 8 is a comparison showing the relationship between degree of vacuum in each vacuum chamber of an apparatus of the embodiment and an apparatus of a comparative example.
Figure 9:
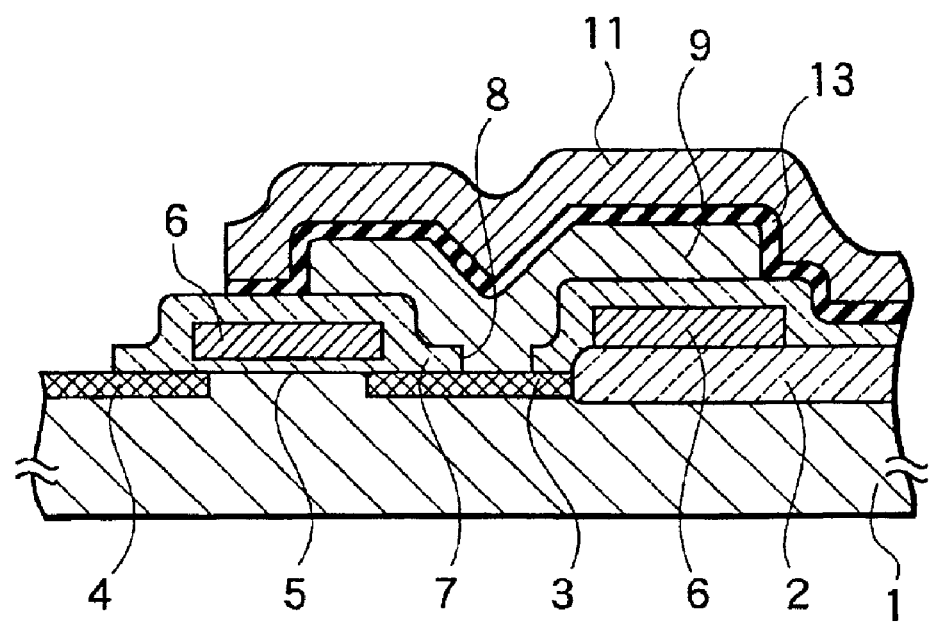
FIG. 9 is a cross-sectional view showing the structure of an ordinary DRAM having a capacitor.
Figure 10:
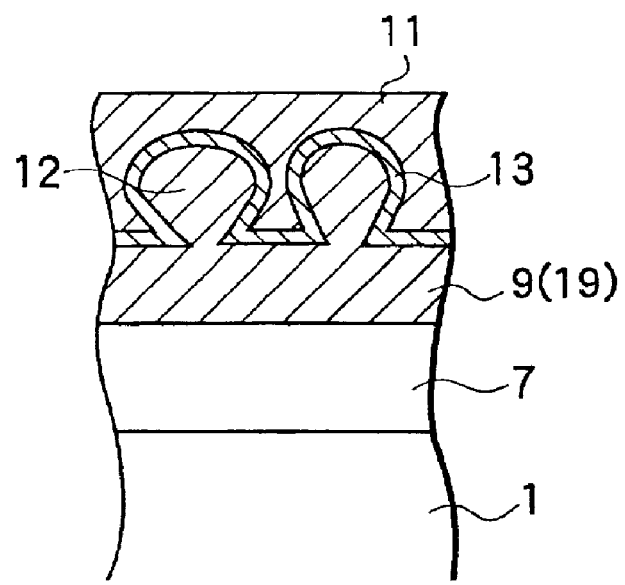
FIG. 10 is a partial cross-sectional view showing the structure of a capacitor electrode portion of a DRAM.

In FIG. 6, which shows a hot-wall-type single wafer mode film growth apparatus, a reaction chamber 30, which is connected to a transfer chamber 20 via a gate valve 50, has a nozzle 130 for supplying monosilane gas ($SiH_4$) to a gas system required for film formation, and constitutes the equivalent of an ultra-high vacuum in accordance with a gas being made to flow from a single direction, and being drawn by suction by a turbo-molecular pump 140 through a discharge tube 135 of the opposite direction to the nozzle 130 relative to wafers 110. Furthermore, the volume of the reaction chamber is around 25.5 l (liters). A flow rate control valve 315 is provided in the tube passing through the nozzle 130 for supplying $SiH_4$, and this flow rate control valve 315 is controlled by flow rate controlling means so that the flow rate of $SiH_4$ gas to be supplied inside the reaction chamber 30 constitutes a prescribed flow rate.

Making an $SiH_4$ gas flow in a single direction relative to a wafer surface enables good selectivity, and assures wafer inplane uniformity. This is the reason for using monosilane, which has a slower growth rate than disilane, and facilitates control of HSG formation. Of the compound gases that comprise silicon, monosilane grows at a lower temperature than dichlorosilane, making it effective at inhibiting the crystallization of the amorphous silicon layer of a base.

When reaction chamber pressure is set at a low 0.5 Pa or less, gas flow velocity becomes faster, and in accordance with sufficient surface reaction rate control at 600–620° C., wafer inplane uniformity is excellent. Further, the structure of the reaction chamber 30 makes it easy to ensure in a short time wafer inplane temperature uniformity by heating the top and bottom wafers using partitioned resistance heating heaters 210 that oppose one another relative to the surface of the wafers 110. Temperature controlling means 320 for controlling the temperature inside the reaction chamber 30 so that same falls within a prescribed temperature range is provided for the partitioned resistance heating heaters 210.

Next, the opposing partitioned resistance heating heaters 210 will be explained, but since the structure is the same for the top and bottom heaters, details of the upper partitioned resistance heating heater 210 are explained by referring to FIG. 7. (a) is a vertical cross-sectional view, and (b) is a bottom view. As can be seen therefrom, the heater is partitioned into 5 heaters. Viewing the reaction chamber 30 from the transfer chamber 20, the near side heater is designated the front resistance heating heater portion 230, the far side heater is the back resistance heating heater portion 240, and of the heaters sandwiched therebetween, the right side heater is designated the right resistance heating heater portion 260, the left side heater is the left resistance heating heater portion 250, and the heater in the center is designated the center resistance heating heater portion 220. In accordance with independently controlling the flow of electricity to the heater portions thereof, it becomes possible to maintain at ±0.5° C. the wafer temperature distribution, which is necessary for the stable formation of an HSG layer.

Now then, prior to transferring to a semiconductor manufacturing apparatus a wafer on which an amorphous silicon layer is formed on a prescribed capacitor electrode portion of a semiconductor chip that will constitute a semiconductor device, this wafer is washed beforehand using, for example, a diluted hydrofluoric acid aqueous solution to remove a natural oxide layer, and a chemical oxide layer formed by a liquid mixture such as $NH_4OH+H_2O_2+H_2O$, following which it is subjected to a drying process using a spin dry dryer. After the drying process, the wafer is rapidly transferred in a clean state to a load-lock chamber 10 inside the semiconductor manufacturing apparatus shown in FIG. 5.

Growing a film on a clean wafer is done to prevent contamination of the environment within the clean room inside the semiconductor manufacturing apparatus, beginning with the load-lock chamber 10, and to prevent the reformation of a natural oxide layer, and cleaning must be performed rapidly during the interval up until the wafer is transferred to the load-lock chamber 10. At this point in time, if much contaminants or a natural oxide layer are adhering/formed on the surface of the amorphous silicon, the silicon bonding density between the state of the amorphous silicon surface and the state, for example, of a natural oxide surface deposited on the amorphous silicon, will differ, thereby generating the problem of HSG not being formed, or of HSG formation states, that is, HSG grain size and density, differing, and becoming the cause of reduced yields of semiconductor devices.

As described above, after transferring a wafer to the load-lock chamber 10, the pressure inside the load-lock chamber 10 is reduced, and the ambient air removed while carrying out a high-purity nitrogen purge. Reducing pressure while performing a high-purity nitrogen purge is done to satisfy the condition that moisture fully saturate the environment in accordance with the dry nitrogen purge, and to prevent all the moisture (liquid) adhering to the surface of a wafer, and cassette from becoming water vapor (gas) in accordance with a sudden drop in pressure, thereby preventing the temperature from dropping and the moisture from becoming ice (solid) as a result of heat being captured when even a portion of the moisture becomes a gas. Because ice is melted by heat and becomes water after being transferred inside the reaction chamber 30, a portion of the surface of a wafer oxidizes, and becomes a primary factor in retarding the formation of HSG. Furthermore, there is also the effect that an gaseous stream is created by purging, thereby discharging contaminants. Further, raising and lowering a plurality of times the pressure inside the load-lock chamber 10 is also effective at achieving maximum displacement of residual substances.

After removing impurity materials such as water and oxygen from the environment of the load-lock chamber 10 as described above, a nitrogen purge is used to make the pressures of the load-lock chamber 10, transfer chamber 20, and reaction chamber 30 approximate one another, and the respective gate valves 40, 50 are opened, after which a wafer is transferred to the reaction chamber 30. The transfer chamber 20 is constantly being purged with nitrogen so that impurity materials 10 existing/generated inside the transfer chamber 20 do not adhere to the surface of a wafer.

FIG. 8 shows the constitution of the degree of vacuum of each of the vacuum chambers in the embodiment apparatus compared to a comparative example apparatus. As can be seen from this figure, the comparative example apparatus requires the mounting to all the chambers of a pump corresponding to an ultra-high vacuum ($10^{-6}$ Pa), but for the embodiment apparatus, with the exception of the reaction chamber, the vacuum chambers are not mounted with pumps corresponding to an ultra-high vacuum ($10^{-6}$ Pa). This is because, in accordance with an environment from which moisture has been removed, and the carrying out of nitrogen purging as described above, it has become possible to transfer to the reaction chamber a wafer surface that is in a clean state, thereby doing away with the need for ultra-high vacuum-equivalent pumps for all but the reaction chamber 30.

Because heating with the above-mentioned opposing partitioned resistance heating heaters 210 facilitates the ensuring in a short period of time of wafer inplane temperature uniformity, the surface state, and state of crystallization and the like of a wafer change in line with temperature and duration. For example, for amorphous silicon, this heating is effective in processing which facilitates reaction on an amorphous silicon layer, but impedes reaction on a polysilicon layer, thus making it effective for HSG formation processing. Further, because the ensuring of temperature uniformity in a short period of time is facilitated by a partitioned resistance heating heater 210, it is not necessary to perform processing at a low crystal nuclei formation temperature of 560–580° C. as with a conventional batch-mode vertical-type apparatus, thereby enabling HSG formation to be carried out at a high temperature of over 580° C.

Consequently, processing can be performed in a short period of time, making it possible to enhance throughput. In other words, if HSG formation is performed at 600–620° C. using this semiconductor manufacturing apparatus, which is capable of maintaining the temperature distribution of a wafer at ±0.5° C., high-density HSG can be selectively formed in a state wherein high throughput is assured. Further, as needed, wafer inplane uniformity can also be further enhanced by furnishing temperature gradients to the set temperatures of the resistance heating heater portions 230, 240, 250, 260 surrounding the center resistance heating heater portion 220 of this partitioned resistance heating heater 210.

In this manner, according to an aspect of the embodiment, it is possible to contribute greatly toward stable HSG formation, as well as selective HSG growth, toward enhancing wafer inplane grain formation uniformity, and toward improving throughput. Furthermore, as for the degree of vacuum inside the reaction chamber 30, it has been ascertained that HSG formation is possible even in a vacuum for which a turbo-molecular pump 140 is not mounted, but pulling an ultra-high vacuum is effective for complete assurance of selectivity.

Now then, in a semiconductor device manufacturing method, which uses an HSG layer as a capacitor electrode, it is important that there are no defects in the HSG layer, and that there is selectivity. Here, the HSG layer formation method in this aspect of the embodiment is such that, after stabilizing the temperature of a substrate, first crystal nuclei are formed on an amorphous silicon layer, HSG are formed by growing the formed crystal nuclei, and the surface of the amorphous silicon layer is converted to a bumpy HSG layer. Furthermore, substrate temperature stabilization is performed in around 5 minutes, the formation of crystal nuclei takes between 2–2.5 minutes, and the growth of the formed crystal nuclei is performed in a 3–5 minute time period. Defects and selectivity will be explained in detail hereinbelow.

(1) Defects

Figure 2:
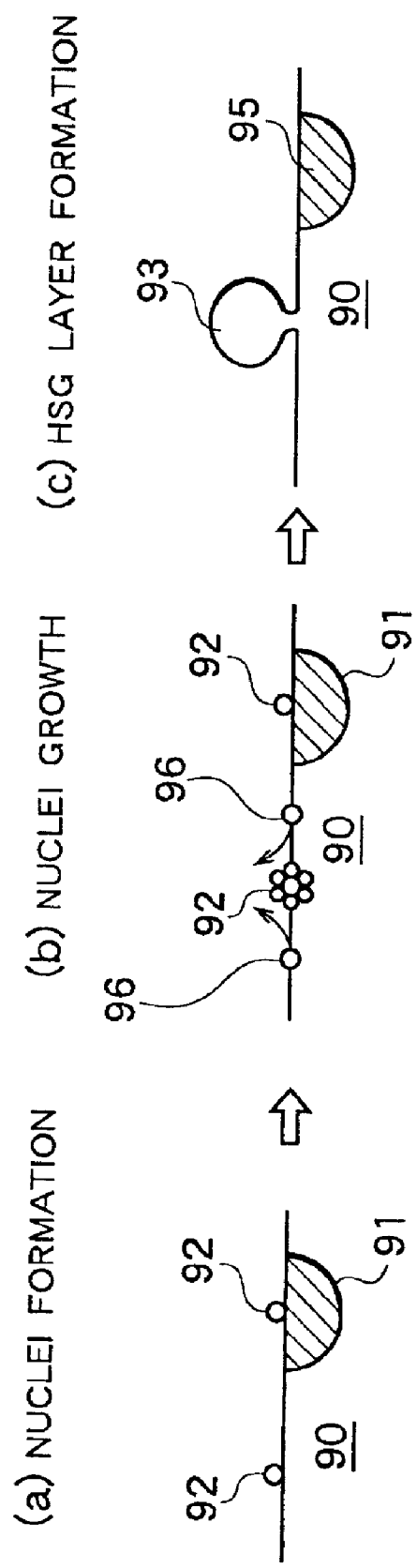
FIG. 2 is a schematic diagram showing the mechanism by which a defect is formed.

What is referred to here as a defect is a portion where HSG does not form when forming an HSG layer. The mechanism by which a defect is formed is as follows. In this aspect of the embodiment, when the temperature reaches a high 620° C. or more, as shown in FIG. 2, a portion of the amorphous silicon 90, which is the base, begins to crystallize (FIG. 2(*a*)). As a result thereof, even if annealing for growing silicon crystal nuclei 92 is performed for the crystallized portion 91, the migration of silicon molecules peripherally to a crystal nucleus is retarded, and the crystal nucleus stops growing. Conversely, by performing annealing for the amorphous portion (portion that has not crystallized), silicon molecules 96 of the surface of the amorphous silicon layer peripherally to a crystal nucleus 92 migrate, and grow by aggregation (FIG. 2(*b*)). As a result thereof, an HSG 93 is formed in the amorphous portion, but an HSG 93 is not formed in the crystallized portion, and it remains as a defect 95 (FIG. 2(*c*)). By contrast thereto, when nuclei formation is performed at a temperature of under 620° C., because there is practically no crystallization of the amorphous silicon 90, which is the base, practically no defects are formed, and a stable, defect-free HSG layer is formed.

Figure 3:
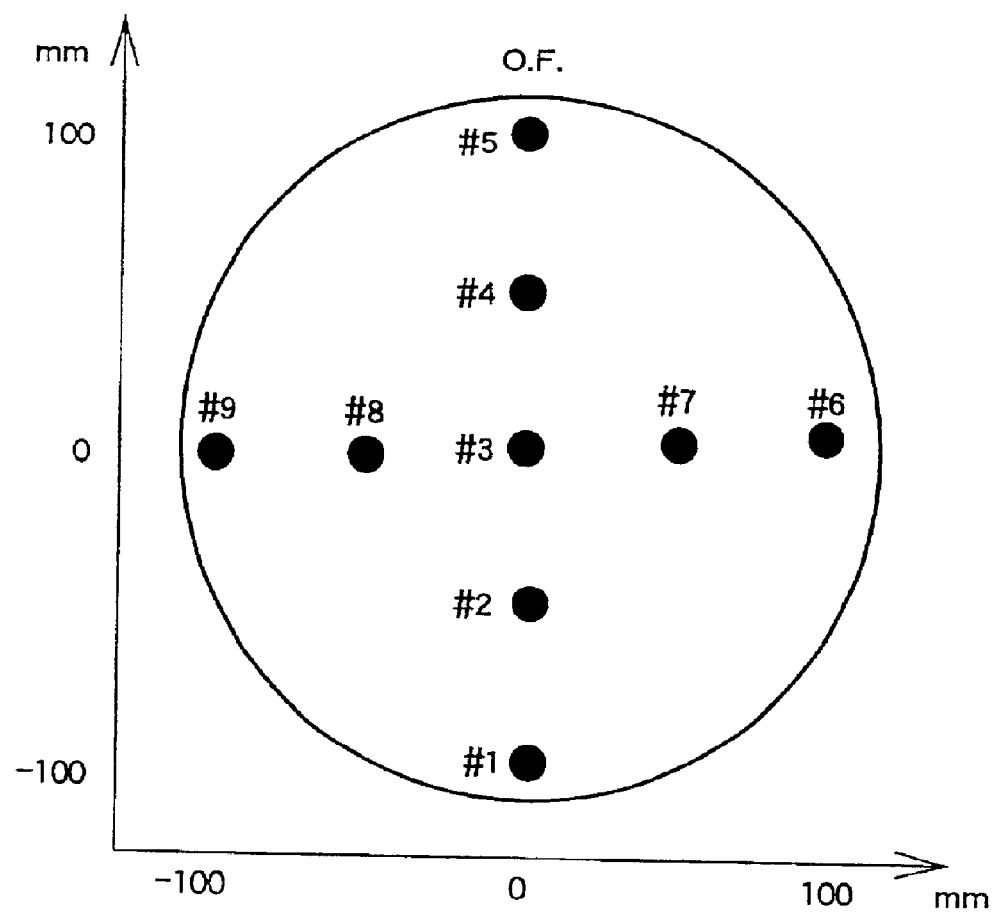
FIG. 3 is a schematic diagram showing the inplane observation points of a Si wafer when ascertaining the presence or absence of defects of an HSG layer.

A determination as to the presence or absence of the above-mentioned defect is made as follows. Following HSG formation, either arbitrary or predetermined points of an Si wafer surface are observed via a SEM (scanning electron microscope), and the presence or absence of a defect in this portion is confirmed visually. If, for example, an 8-inch wafer is taken as an example, predetermined points are the 9 points shown in FIG. 3. When a defect is not discovered at any of these observation points #1–#9, it is determined that defects do not exist. When a defect is discovered at any of the observation points, it is determined that defects do exist.

Figure 4:
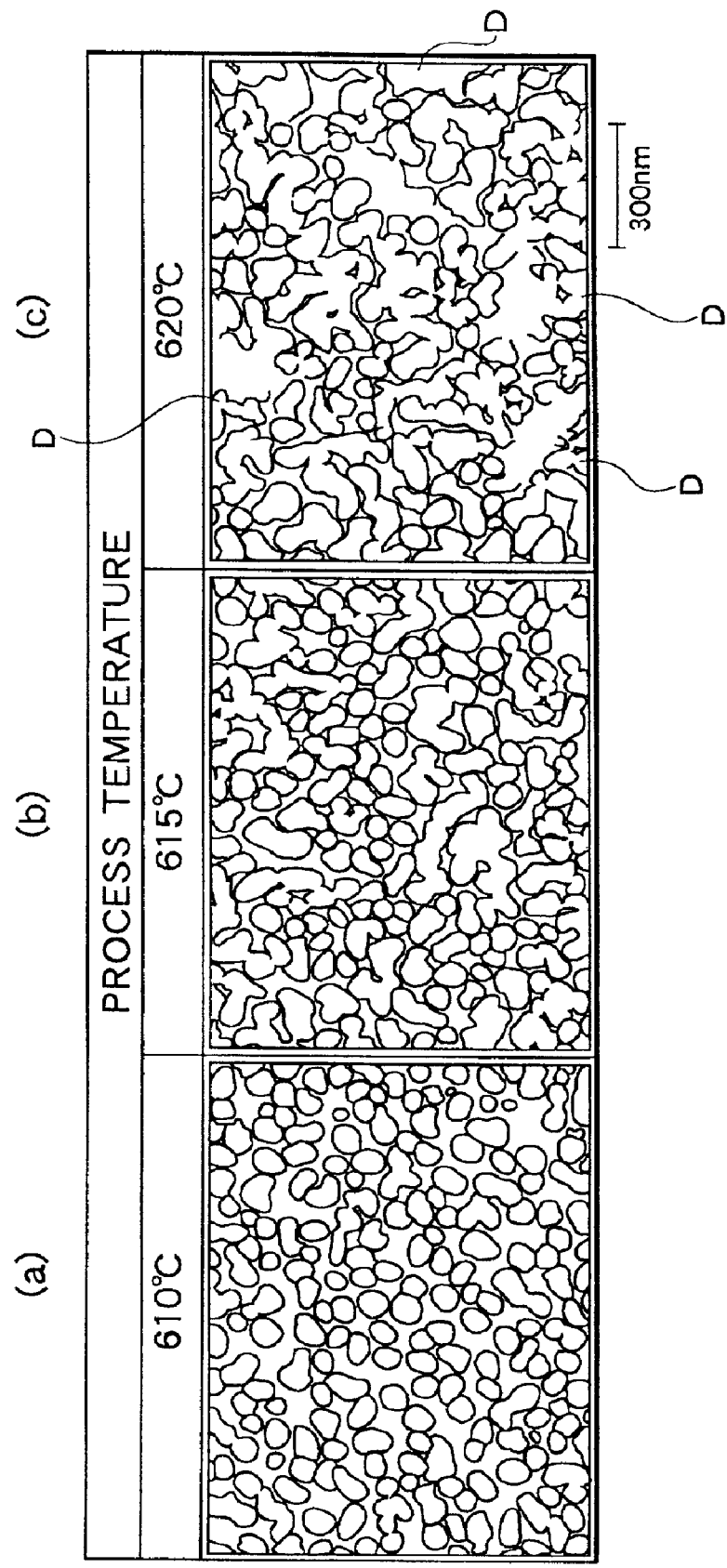
FIG. 4 is a SEM photograph of when HSG is formed.

FIG. 4 shows SEM photographs of when HSG was formed. FIG. 4(*a*), (*b*), (*c*) are SEM photographs of when the respective crystal nuclei formation temperatures were 610° C., 615° C., and 620° C. Common conditions at this time were as follows.

$SiH_4$ Flow rate: 100 sccm

Nuclei Formation (Seeding) Time: 2 minutes

Nuclei Growth (Anneal) Time: 5 minutes

Amorphous Silicon Formation Conditions: 530° C., $SiH_4$ base

Defects are not formed at the crystal nuclei formation temperatures of 610° C. and 615° C. shown in FIG. 4(*a*), (*b*), but defects are formed at the 620° C. shown in FIG. 4(*c*). The blackened portions D are defects. Therefore, it was learned that if the crystal nuclei formation temperature is under 620° C., at the least if it is less than 615° C., defects are not formed. In the present invention, when it is said that practically no defects occurred, it refers to a state this side of reaching FIG. 4 (*c*). And when it is said that defects almost certainly do not exist, it refers to the states of FIG. 4 (*a*),(*b*).

(2) Selectivity

As referred to herein, selectivity means selectivity relative to an $SiO_2$ layer, an $Si_3N_4$ layer or some other silicon-based dielectric layer that exists peripherally to an amorphous silicon layer when forming HSG on the surface of an amorphous silicon layer, which is a base. That is, in a case in which a silicon-based dielectric layer (such as an inter-level dielectric layer) is formed peripherally to a capacitor electrode, there is said to be selectivity when HSG is formed only on the surface of the amorphous silicon layer of a capacitor electrode, without HSG being formed on the surface of the silicon-based dielectric layer, which is a non-capacitor electrode portion. Furthermore, among the various processes in HSG formation (temperature stabilization process, nuclei formation process, nuclei growth process), that process which influences selectivity, is the process in which $SiH_4$ exists inside the reaction chamber, that is, the nuclei formation (Seeding) process.

The method for determining the presence or absence of selectivity is performed as follows. For layers to be furnished with selectivity (layers for which nuclei are not to be formed), that is, for $SiO_2$ layers and other silicon-based dielectric layers, the same processing as the processing for forming HSG on an amorphous silicon layer is performed (the same apparatus is also used), the thickness of the dielectric layer is measured and compared before and after processing, and when the thickness increases subsequent to processing, it is presumed that nuclei formation also took place on the layer thereof, and it is determined that selectivity does not exist. Further, when the thickness does not increase subsequent to processing, it is presumed that nuclei formation did not take place on the layer thereof, and it is determined that selectivity does exist.

In this manner, a selectivity evaluation determination is performed by measuring the amount of increase in layer thickness before and after processing. Furthermore, the amount of increase in layer thickness refers to thickness growth achieved by correcting the thickness of an Si layer deposited on a dielectric layer to the thickness of the dielectric layer. That is, when HSG processing is performed having a dielectric layer of $SiO_2$, and thickness increases subsequent to processing, prior to processing it is the thickness of a single layer of $SiO_2$, and subsequent to processing, it becomes stacked layers of Si and $SiO_2$, but these stacked layers are corrected to $SiO_2$, in other words, measurement is performed by presuming that Si is also $SiO_2$. Furthermore, thickness is measured using an ellipsometer.

Figure 1:
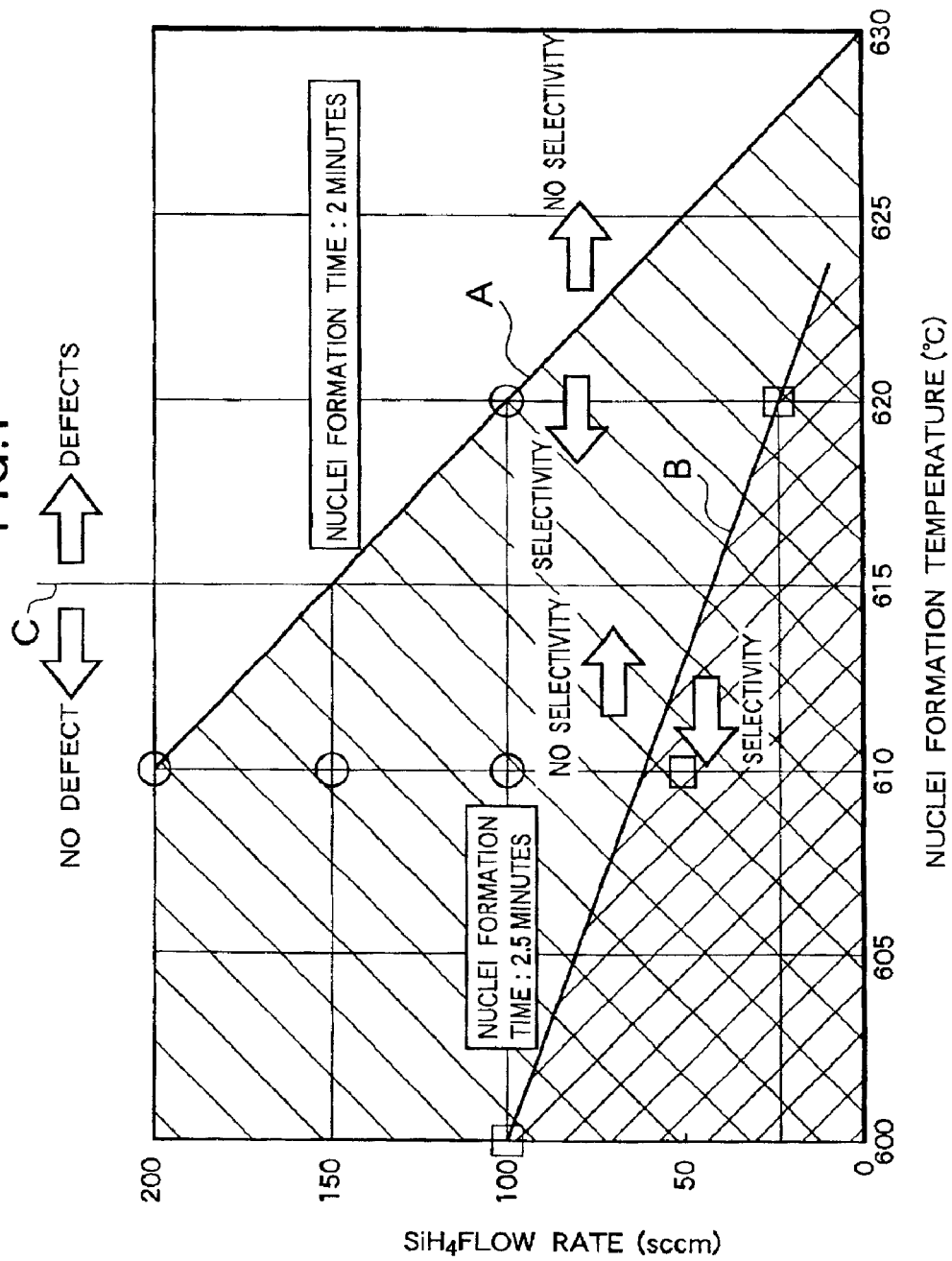
FIG. 1 is a diagram of a process window showing the relationship between nuclei formation temperature and SiH4 flow rate according to an aspect of the embodiment.

FIG. 1 shows the results of using this method to perform evaluations under a variety of conditions. The nuclei formation temperature (° C.) inside the reaction chamber is represented by the horizontal axis, the flow rate of $SiH_4$ is represented by the vertical axis, and FIG. 1 indicates the range of combinations of all conditions by which base selectivity can be achieved, that is, the HSG process window. In the figure, the circles (○) and squares ( ) indicate examples of conditions under which there was selectivity when nuclei formation time was 2 minutes, and 2.5 minutes, respectively. Furthermore, common conditions are as listed hereinbelow.

Preheat Time (Temperature stabilization prior to nuclei formation): 5 minutes

Annealing Time (For nuclei growth): 5 minutes

From FIG. 1, it can be discerned that selectivity is related to nuclei formation time and $SiH_4$ flow rate, in addition to temperature. More specifically, when nuclei formation time is 2 minutes, selectivity can be achieved when processing is carried out using the conditions to the left side of straight line A, which connects the point of (620° C., 100 sccm) and the point of (610° C., 200 sccm), and selectivity cannot be achieved when processing is carried out using the conditions to the right side of straight line A. Further, when nuclei formation time is 2.5 minutes, selectivity can be achieved when processing is carried out using the conditions to the left side of straight line B, which connects the point of (620° C., 25 sccm) and the point of (600° C., 100 sccm), and selectivity cannot be achieved when processing is carried out using the conditions to the right side of straight line B.

Therefore, to selectively form an HSG layer only on an amorphous silicon layer without forming same on a silicon-based dielectric layer, for the condition in which nuclei formation time is 2 minutes, crystal nuclei can be formed by controlling the nuclei formation temperature and SiH4 flow rate so that same fall within the area to the left side of straight line A, which connects point (620° C., 100 sccm) and point (610° C., 200 sccm) in FIG. 1. Further, for the condition in which nuclei formation time is 2.5 minutes, crystal nuclei can be formed by controlling the nuclei formation temperature and $SiH_4$ flow rate so that same fall within the area to the left side of straight line B, which connects point (620° C., 25 sccm) and point (600° C., 100 sccm).

Furthermore, in FIG. 1, determination results of the presence or absence of defects are shown together with the determination results of the presence or absence of selectivity. In this aspect of the embodiment, FIG. 1 indicates that defects are dependent solely on temperature. If the temperature is under 620° C., an HSG layer can be produced with practically no defects. And if the temperature is 615° C. or less, the HSG layer capable of being produced is almost certainly defect-free. Furthermore, in FIG. 1, straight line C alone indicates a fixed temperature of 615° C. That is, straight line C indicates that when processing is performed under the conditions to the left side of straight line C, it is almost certain that defects will not be formed, but when processing is performed under the conditions to the right side of straight line C, there is a possibility that defects will be formed.

From the above, to selectively form a defect-free HSG layer solely on an amorphous silicon layer, in FIG. 1, for the condition wherein nuclei formation time is 2 minutes, crystal nuclei can be formed by controlling nuclei formation temperature and $SiH_4$ flow rate so that same fall within the area to the left side of straight line C, and to the left side of straight line A, that is, the area enclosed by straight line C and straight line A. And for the condition wherein nuclei formation time is 2.5 minutes, crystal nuclei can be formed by controlling nuclei formation temperature and $SiH_4$ flow rate so that same fall within the area to the left side of straight line C, and to the left side of straight line B, that is, the area enclosed by straight line C and straight line B. Furthermore, it was ascertained by experiments that forming HSG under the conditions within this area also made it possible to achieve the desired HSG grain density.

Now, (1) uniformity of HSG grain size and grain density, and (2) the selective growth of HSG depend not only on temperature, but also on duration, pressure, and the flow rate of $SiH_4$, and will change in accordance with changes thereof. That is, the results of the above-mentioned (1) and (2) cannot be achieved by limiting only temperature. For example, even when HSG is formed at 590° C., lengthening the duration makes it possible to achieve high grain density (150 grains/$\mu$ m²). And even when HSG is formed at 630° C., for example, reducing the flow rate of $SiH_4$ makes it possible to achieve selectivity. Therefore, as conditions for enabling selective growth, it is significant that conditions be limited to those that fall within the area to the left side of straight line A in FIG. 1, which relates nuclei formation temperature to $SiH_4$ flow rate. By contrast, concerning (3) defects, when substrate heating time up until the formation of HSG is comparatively short as in this aspect of the embodiment, because defects are dependent solely on temperature, it is significant that the temperature range be limited to under 620° C., and more preferably to less than 615° C. Control of these parameters is performed in accordance with the above-mentioned flow controlling means 310 and temperature controlling means 320.

The process that is performed inside a reaction chamber will be explained.

As described above, a wafer, which, after being washed for 1 minute using a 1% hydrofluoric acid aqueous solution to remove a natural oxide layer, and a chemical oxide layer, and being subjected to a drying process using a spin dry dryer or the like, is rapidly transferred to a load-lock chamber 10, and the ambient air is removed from the load-lock chamber 10 by reducing pressure while performing a high-purity nitrogen purge. Furthermore, the pressure inside the load-lock chamber 10 is raised and lowered a plurality of times, the pressures inside the load-lock chamber 10, transfer chamber 20, and reaction chamber 30 are equalized while purging with nitrogen, and the wafer is transferred to the reaction chamber 30.

First, efforts are made to stabilize the temperature of the transferred wafer 110 at the reaction chamber temperature of 600–620° C., which was set beforehand. As for the environment at this time, temperature stabilization is performed in a non-reactive gas environment, which does not react with the amorphous silicon surface, such as a high vacuum, nitrogen, or inert gas environment. However, taking into consideration both temperature stabilization and crystallization so as not to cause the retardation of HSG formation in accordance with wafer inplane temperature stabilization, and the crystallization of the base amorphous silicon, it is desirable that temperature stabilization time be around 5 minutes. Thereafter, the above-mentioned reaction chamber temperature is maintained.

Next, in the case of a non-reactive gas environment, after these gases have been completely removed, fine crystal nuclei are formed (generated) on the surface of the amorphous silicon in accordance with allowing between 25–200 cc of monosilane to flow every minute for between 2 minutes–2.5 minutes. The density of these crystal nuclei tends to increase as wafer temperature and nuclei formation time are increased, and when the flow rate of monosilane is reduced, nuclei formation time must be increased.

Lastly, the supply of monosilane is stopped, and the crystal nuclei, which formed on the surface of the amorphous silicon, are enlarged (grown) in accordance with the migration of silicon molecules. The size of these crystal grains tends to become larger as grain growth time is increased, and since growth is almost maximal after 5 minutes, growth time is controlled at between 3–5 minutes. When growth time is too long, grains bond with one another to form large grains, thereby decreasing the growth rate of the surface area, which this process has as an object, and requiring that time be controlled.

As a specific example, a clean amorphous silicon surface was maintained in accordance with replacing the ambient air of the load-lock chamber by reducing pressure while performing a high-purity nitrogen purge, and in accordance with processing a wafer, which was transferred to the reaction chamber 30 by passing as-is through a nitrogen-purged transfer chamber 20, under the above-mentioned prescribed conditions, for example, a reaction chamber temperature of 610° C., a temperature stabilization time of 5 minutes, 200 sccm of monosilane ($SiH_4$), nuclei formation time of 2 minutes, and grain growth time of 3 minutes, it was possible to form stable HSG having selectivity, and to form HSG with good wafer inplane uniformity. And the same results were achieved even with a reaction chamber temperature of 610° C., a temperature stabilization time of 5 minutes, 50 sccm of monosilane ($SiH_4$), nuclei formation time of 2.5 minutes, and grain growth time of 5 minutes. In accordance therewith, HSG with outstanding wafer inplane uniformity were formed at a rate of 20 wafers/hr, thus making it possible to increase the number of wafers more than the 16 wafer/hr of a vertical-type apparatus process, and enabling enhanced throughput.

According to the method of the present invention, in accordance with finding the optimum conditions of an HSG process, it is possible to enhance yields by forming a stable, defect-free HSG layer, and in accordance with high selectivity, it is possible to improve productivity by eliminating etchback.

Further, according to the apparatus of the present invention, it is possible to readily implement the above-mentioned manufacturing method by simply changing the controlled variables of existing control means.

What is claimed is:

1. A semiconductor device manufacturing method, comprising:

forming crystal nuclei to be nuclei of a Hemispherical Grained Silicon (HSG) layer only on an amorphous silicon layer, out of the amorphous silicon layer for a capacitor electrode and a silicon-based dielectric layer, which are formed on a surface of a substrate, by supplying a monosilane ($SiH_4$) in reaction chamber where the substrate is received; and forming the HSG layer only on the amorphous silicon layer by growing the crystal nuclei, and wherein when the crystal nuclei is formed, pressure in the reaction chamber is set to be in a range of 0.5 Pa or less, and also a temperature (° C.) of the substrate and a supplying flow rate (sccm) of the monosilane are set within a prescribed range, and wherein the prescribed range is bounded by an area surrounded by three straight lines listed below on rectangular coordinates defined by orthogonal X-axis and Y-axis where the temperature (° C.) of the substrate is represented along the X-axis and the supplying flow rate (sccm) of monosilane is represented along the Y-axis:

X=600° C.

Y=25 sccm

Y=10X+6,300.

2. The method according to claim 1, wherein the temperature of the substrate when crystal nuclei is formed is set in a temperature range of no less than 600° C. and under 620° C.

3. The method according to claim 1, wherein the temperature of the substrate when the crystal nuclei is formed is set in a temperature range of no less than 600° C. and no more than 615° C.

4. The method according to claim 1, wherein the number of the substrates received the reaction chamber is one or two.

5. The method according to claim 1, wherein a temperature distribution within a face of the substrate when the crystal nuclei is formed is kept at ±0.5° C.

6. The method according to claim 1, wherein the reaction chamber is formed in a hot-wall system.

7. The method according to claim 1, wherein when the temperature of the substrate at time of forming the crystal nuclei is set in the prescribed range, the temperature is set by eating the substrate by a heater that is opposed against the surface of the substrate.

8. The method according to claim 1, wherein when the temperature of the substrate at the time of forming the crystal nuclei is set in the prescribed range, the temperature is set by heating the substrate by a partitioned heater that is opposed against the surface of the substrate.

9. The method according to claim 1, wherein when the temperature of the substrate at the time of forming the crystal nuclei is set in the prescribed range, the temperature is set by heating the substrate by a partitioned resistance heater that is opposed against the surface of the substrate.

10. The method according to claim 1, wherein when the temperature of the substrate at the time of forming the crystal nuclei is set in the prescribed range, it is set by heating the substrate from both sides of an upper surface and a lower surface of the substrate.

11. The method according claim 1, wherein the monosilane (SiH$_4$) is supplied to the surface of the substrate from a side direction of the substrate in a single direction.

12. The method according to claim 1, wherein the monosilane (SiH$_4$) is supplied to the surface of the substrate in a direction parallel to the surface of the substrate.

13. The method according to claim 1, wherein supplying time of the monosilane (SiH4) is set to be 2 minutes or more.

14. The method according to claim 1, wherein supplying time of the monosilane (SiH$_4$) is set to be 2 to 2.5 minutes.

15. The method according to claim 1, wherein supplying flow rate of the monosilane (SiH$_4$) is set to be 25 to 200 sccm.

* * * * *

UNITED STATES PATENT AND TRADEMARK OFFICE
CERTIFICATE OF CORRECTION

PATENT NO. : 6,943,089 B2
DATED : September 13, 2005
INVENTOR(S) : Yushin Takasawa and Hajime Karasawa It is certified that error appears in the above-identified patent and that said Letters Patent is hereby corrected as shown below:

<u>Column 16,</u>
Line 34, please change "Y=10X+6,300." to -- Y=-10X+6,300. --.
Line 47, please change "face" to -- surface --.
Line 52, after "at" insert -- the --.
Line 54, please change "eating" to -- heating --.

Signed and Sealed this

Twenty-ninth Day of November, 2005

JON W. DUDAS
*Director of the United States Patent and Trademark Office*